(12) United States Patent
Chong et al.

(10) Patent No.: US 8,045,401 B2
(45) Date of Patent: Oct. 25, 2011

(54) SUPPORTING SCAN FUNCTIONS WITHIN MEMORIES

(75) Inventors: Yew Keong Chong, New Braunfels, TX (US); Gus Yeung, Austin, TX (US); Paul Darren Hoxey, Cambridge (GB); Paul Stanley Hughes, Sunnyvale, CA (US); Gary Robert Waggoner, San Jose, CA (US)

(73) Assignee: ARM Limited, Cambridge (GB)

( * ) Notice: Subject to any disclaimer, the term of this patent is extended or adjusted under 35 U.S.C. 154(b) by 125 days.

(21) Appl. No.: 12/585,626

(22) Filed: Sep. 18, 2009

(65) Prior Publication Data
US 2011/0072323 A1 Mar. 24, 2011

(51) Int. Cl.
*G11C 7/00* (2006.01)
(52) U.S. Cl. ............................. 365/189.12; 365/189.05
(58) Field of Classification Search ............. 365/189.05, 365/189.12
See application file for complete search history.

(56) References Cited

U.S. PATENT DOCUMENTS

| 7,272,069 B2* | 9/2007 | Su ............................... 365/233.1 |
| 7,286,434 B2* | 10/2007 | Mori et al. ..................... 365/222 |
| 7,751,256 B2* | 7/2010 | Chan et al. ............... 365/189.05 |
| 7,796,434 B2* | 9/2010 | Jang et al. ................ 365/185.18 |

* cited by examiner

*Primary Examiner* — Michael Tran
(74) *Attorney, Agent, or Firm* — Nixon & Vanderhye P.C.

(57) ABSTRACT

A memory is disclosed comprising: a storage array for storing data; and access circuitry for transmitting data to and from the storage array. The access circuitry forms a data path for inputting and outputting data to the storage array. The access circuitry comprises a latch configured to latch in response to a first phase of a first clock signal and a further latch configured to latch in response to a second phase of a second clock signal, the further latch comprises an output latch for outputting the data from the storage array, and the first and second clock signals are synchronized with each other. The memory further comprises: a multiplexer, a scan input and a scan enable input, the multiplexer being responsive to an asserted scan enable signal at the scan enable input to form a scan path comprising the latch and the further latch connected together to form a master slave flip flop, such that scan data input at the scan input passes through the master slave flip flop and not through the storage array while the scan enable signal is asserted and is output by the output latch.

18 Claims, 7 Drawing Sheets

SUPPORTING SCAN FUNCTIONS WITHIN MEMORIES

TECHNICAL FIELD

The technical field relates to memories and in particular to memories that can support scan functions.

BACKGROUND

It is desirable for data processing and data storage systems to be able to support scan functions that allow test data to be input to certain nodes of the system and to be scanned out of the system, thereby enabling effective testing of the system. In order to be able to support a scan function within a memory macro, all input and output latches must be able to hold the scan value during a scan sequence. A simple way of implementing this would be to convert each input or output latch into a flip-flop. However, this has the disadvantage of significantly increasing the area for the memory.

A further problem with testing memory macros, is associated with testing standard cell logic attached to the outputs of memory macros. Testing this logic efficiently is difficult as writing through the memory can take many test cycles. Test time is expensive so reducing it is important. Adding multiplexers to bypass the memory introduces at-speed test issues and also adds extra logic into potentially critical timing areas which could impact overall system performance in normal operation.

FIG. 1a shows a memory macro 5 having a storage array 10, an output latch 20 and input latch 30 according to the prior art. This memory macro 5 has a data input D for inputting data in response to a write request to input latch 30. This is then sent for storage to array logic 10 and in response to a read request is read out using sensing circuitry 40 to output latch 20. Input latch 30 is clocked by CLKB while output latch 20 is clocked by clock CLKA. These clocks are synchronised with each other. In addition to these input and output latches there are additional input latches 31 and 32 which are used to input test data which can be stored in the array during a testing sequence.

FIG. 1b shows such a memory macro according to the prior art that has been converted to support a scan function by adding an additional latch 22, a multiplexer 26 and a scan input gate 24 at the output of the memory. This additional latch is clocked by the same clock CLKA as the output latch and acts with this latch as a flip flop. There is a scan input to this additional latch 22 and when the input gate 24 is enabled using scan enable signal SE, the scan input is transmitted to latch 22 and is clocked through the two latches 20, 22 that are connected together via multiplexer 26 to form a flip flop and is output as scan data. In normal functional operation this input gate 24 is switched off and data entering the array logic is output in the conventional fashion.

As can be seen providing a scan function in this way requires an additional latch 22 as well as gating circuit 24 and multiplexer 26.

It would be desirable to produce an improved memory that was able to support an efficient scan function.

SUMMARY

A first aspect provides a memory comprising: a storage array for storing data; and access circuitry for transmitting said data to and from said storage array, said access circuitry forming a data path for inputting and outputting data to said storage array, said access circuitry comprising a latch configured to latch in response to a first phase of a first clock signal and a further latch configured to latch in response to a second phase of a second clock signal, said further latch comprising an output latch for outputting said data from said storage array, and said first and second clock signals are synchronised with each other; said memory further comprising: a multiplexer, a scan input and a scan enable input, said multiplexer being responsive to an asserted scan enable signal at said scan enable input to form a scan path comprising said latch and said further latch connected together to form a master slave flip flop, such that scan data input at said scan input passes through said master slave flip flop and not through said storage array while said scan enable signal is asserted and is output by said output latch.

The inventors recognized that memories have access circuitry that provides a path for inputting and outputting the data to the storage array and that this access circuitry often comprises latches that are responsive to opposite phases of a clock signal, the clock signals that clock the latches being synchronised with each other. In order to provide a scan function, the scanned values need to be held during the scan sequence and this can be done using a flip flop. By introducing a multiplexer that is controlled by a scan enable signal, two latches that are already present in the access circuitry can be combined to form a flip flop that will hold the required values during scan.

In this way, circuitry that already exists within the memory can be reused in scan to hold the scan values and thus, a memory that is capable of efficiently supporting a scan function can be produced by adding only a very few additional components.

In some embodiments said memory comprises a port for receiving read requests for reading data from said storage array, said port comprising a sense amplifier circuit for sensing and latching a value stored in a storage cell of said storage array in response to a sensing signal triggered by said first phase of said first clock signal, and said output port for outputting said sensed value; wherein said sense amplifier comprises said latch; and said multiplexer is configured to isolate said scan input from said sense amplifier in response to said scan enable signal not being asserted and to connect said scan input to said sense amplifier in response to said scan enable signal being asserted.

Ports that are configured to receive read requests in a memory comprise a sense amplifier circuit which senses and latches a value stored in the storage cell. Thus, with some additional components this sensing amplifier circuit can be used as the first latch of a flip flop with the output latch of the memory used as the second latch in the flip flop. A multiplexer is used to connect the scan input to the sense amplifier when the scan enable signal is asserted and to isolate it from the sense amplifier when it is not asserted. In this way the sense amplifier can operate to both sense and latch a stored value in the normal way when scan function is not operational but can act as the first latch in a flip flop when it is operational.

In some embodiments, said first and second clock signal comprise a same clock signal.

In many memory systems the sense amplifier and output latch will be clocked by the same clock signal and thus, if connected together will function well as a flip flop. In other embodiments the second clock signal may be delayed with respect to the first clock signal. However, such latches can also be successfully combined to form a flip flop provided that the two clock signals are synchronised. If the latches are not synchronised then the time difference between them being clocked will vary and they therefore cannot operate reliably as a flip flop.

In some embodiments, said multiplexer comprises at least one switch arranged to isolate said scan input from said sense amplifier circuitry in response to receipt of said asserted sensing signal.

In order to avoid the data at the scan input flushing through the output latch there is a switch that isolates the scan input from the sense amplifier in response to receipt of the asserted sensing signal. It should be noted that the circuit should have a slight delay present in its path to this switch so that the sensing signal reaches the sensing amplifier circuit before it reaches the switch, this enables the sensing amplifier circuit to be fired before the scan input is isolated from the sense amplifier circuitry. Thus, the scan input is sensed by the sense amplifier but the scan input cannot flush through the output latch.

Although the switch can be formed in a number of ways, in some embodiments it comprises a PMOS transistor that switches in response to the sensing signal.

In some embodiments, said storage cell comprises a bit cell with a bit line and complementary bit line, said sensing amplifier being configured to sense data stored in said bit cell by sensing said bit line and said complementary bit line, and said multiplexer being configured to transmit said scan input and a complementary value of said scan input to said bit line and complementary bit line respectively in response to said scan enable signal.

Storage arrays formed from bit cells are often formed with sensing amplifiers and as these comprise latches these circuits can be amended to support scan function by example embodiments in a convenient fashion.

In some embodiments, said port comprises a read port and said memory further comprises a write port for receiving write requests for writing data to said memory.

In some embodiments, said write port comprises an input latch for latching input data received at said write port, said input latch being clocked by a clock signal that is not synchronised with said second clock signal clocking said output latch.

Many two port memories have input clocks and output clocks that are not synchronised and thus, one cannot combine the input and output latches to form a flip flop. However, this problem has been addressed by example embodiments by recognising that the sense amplifier circuit also comprises a latch and that this latch is clocked by a clock that is synchronised with the output clock. Thus, it utilises this latch to form a flip flop with the output latch and thereby can support a scan function.

In some embodiments, said port is a port configured to receive both write requests and read requests, said port comprising an input latch associated with said port for latching input data in response to a write request, said input latch being clocked by a clock signal that is synchronised with said clock clocking said output latch.

Although some ports are simply read or write ports, in some memories the ports are configured to receive both write requests and read requests. In these systems generally the input latch is clocked by a signal that is synchronised with the signal clocking the output latch and thus, these two latches can be combined to form a flip flop during scan.

In some embodiments, said memory comprises at least one further port, both said port and said at least one further port comprising ports configured to receive both write requests and read requests, each of said ports comprising an input latch associated with said port for latching input data in response to a write request, and an output latch, said input latches being clocked by a clock synchronised with said clock clocking said output latch.

There can be memories with many ports which support both read and write requests. These memories are also suitable for being converted to support scan functions using a multiplexer.

In some embodiments, said memory comprises a port for receiving write requests, said port comprising an input latch for latching a received data value for transmission to said storage array in response to said first phase of said clock cycle, said input latch comprising said latch and said multiplexer being configured to route a signal from said input latch to said output latch in response to said scan enable signal being asserted and to route a signal from said input latch to said storage array in response to said scan enable signal not being asserted.

Some memories have ports for receiving write requests with input latches that are clocked by a clock that is synchronised with the output latch. Thus, in example embodiments these two latches are combined using a multiplexer to form a flip flop and are thus, amended in a simple and area efficient way to support the scan function.

In some embodiments, said input latch and said multiplexer comprise a single multiplexer latch circuit.

In some embodiments the multiplexer is integrated into the latch to form a multiplexer latch. This reduces the performance impact of the additional multiplexer to nearly zero when compared to a multiplexer and latch configured as separate components, it does however require more devices than a simple multiplexer preceding a latch.

In some embodiments, said memory comprises a further multiplexer for receiving a scan input and a data input, said further multiplexer being configured to output said scan input to said input latch in response to a second scan enable signal being asserted, and to output said data input to said input latch in response to said second scan enable signal not being asserted, said access circuitry forming a data write through path from said input latch to said output latch, said data not passing through said storage array in response to said scan enable signal being asserted and said second scan enable signal not being asserted.

The system can advantageously be set up to have a write through path that can write through data without storing it within storage cells of the memory. This takes advantage of the fact that the introduction of the scan path has generated a path that avoids the storage array and simply latches data in and out. Thus, this path can be reused if an additional multiplexer is added to latch through other data which can be used in test cycles.

In some embodiments, said port comprises a port configured to both read and write data, said storage array comprising at least one sense amplifier associated therewith for sensing a value stored in a cell of said storage array, said memory being configured to generate a sensing signal to activate said at least one sense amplifier in response to a read request, said memory being responsive to said scan enable signal being asserted to not generate said sensing signal.

When scanning data, it has been found to be advantageous if the sensing circuitry is not activated as this saves power and the circuitry is not required in this embodiment. Thus, the scan enable signal can be used to turn off the circuitry that generates the sensing signal. This can be done in embodiments where the port is configured as both a read and write port, as in these embodiments there is an input latch that is synchronised with the output latch and as such can be used as the first latch in the flip flop. In embodiments that require the use of the sense amplifier latch as one latch of the flip flop then clearly powering down the sense amplifier during scan would not work.

In some embodiments, said memory comprises at least one further port, said port and said at least one further port comprising ports configured to receive both write requests and read requests, each of said ports comprising an input latch associated with said port for latching input data in response to a write request and an output latch, said input latches being clocked by a clock synchronised with said clock clocking said output latch, said memory being configured to route a signal from said input latch of said at least one further port to said output latch in response to said scan enable signal being asserted and to route a signal from said input latch of said at least one further port to said storage array in response to said scan enable signal not being asserted.

Memories that comprise several read/write ports that are synchronised can be converted to support the scan function by utilising the input and output latches to form a flip flop using multiplexer circuitry.

In some embodiments, said memory is configured to disable said storage array in response to said scan enable signal being asserted.

It is advantageous and saves power if the storage array is disabled during scan as this saves power and it is not required.

A second aspect provides a method of providing a scan function to a memory, said memory comprising: a storage array for storing data; and access circuitry for transmitting said data to and from said storage array, said access circuitry forming a data path for inputting and outputting data to said storage array; said access circuitry comprising a latch configured to latch in response to a first phase of a first clock signal and a further latch configured to latch in response to a second phase of a second clock signal, said further latch comprising an output latch for outputting said data from said storage array, and said first and second clock signals are synchronised with each other; said method comprising the steps of: providing a multiplexer, said multiplexer having a scan input a data input, said multiplexer selecting between said scan input and data input in response to a scan enable signal; inputting said scan enable signal to said multiplexer; in response to said scan enable signal forming a scan path comprising said latch and said further latch connected together to form a master slave flip flop; inputting scan data at said scan input and transmitting said input scan data through said master slave flip flop and not through said storage array.

A third aspect provides a data storage means comprising: a storage array means for storing data; and access means for transmitting said data to and from said storage array means, said access means forming a data path for inputting and outputting data to said storage array means, said access means comprising a latching means for latching in response to a first phase of a first clock signal and a further latching means for latching in response to a second phase of a second clock signal, said further latching means comprising an output latching means for outputting said data from said storage array means, and said first and second clock signals are synchronised with each other; said data storage means further comprising: a multiplexing means, a scan input means and'a scan enable input means, said multiplexing means being responsive to an asserted scan enable signal at said scan enable input to form a scan path comprising said latching means and said further latching means connected together to form a master slave flip flop means, such that scan data input at said scan input passes through said master slave flip flop means and not through said storage array means while said scan enable signal is asserted and is output by said output latching means.

BRIEF DESCRIPTION OF THE DRAWINGS

FIG. 3b shows a memory macro in block form with amendments to support scan similar to those of FIG. 3a;

DESCRIPTION OF EXAMPLE EMBODIMENTS

Figure 1A:
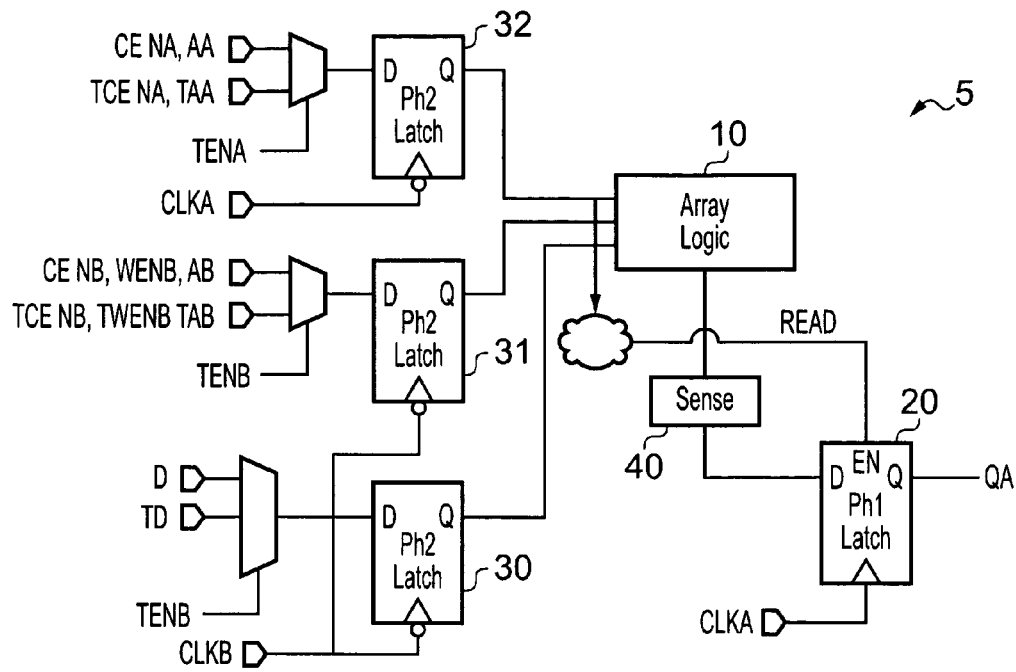
FIG. 1a shows a memory macro according to the prior art.
Figure 1B:
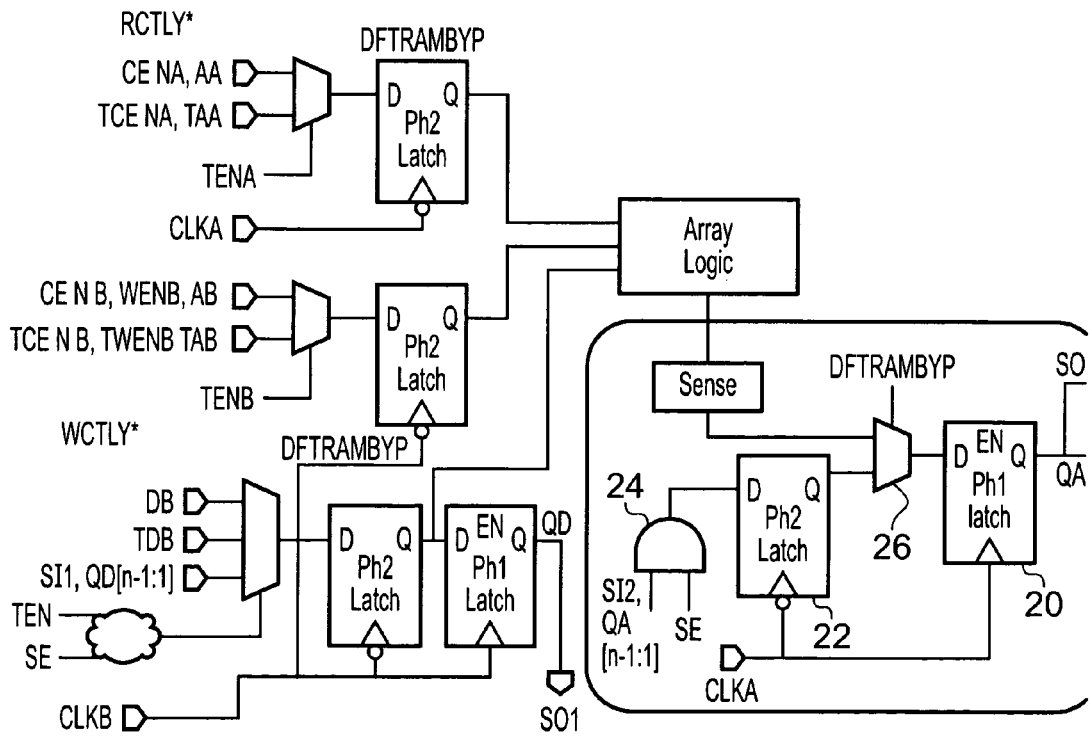
FIG. 1b shows a memory macro amended to support scan according to the prior art.
Figure 2:
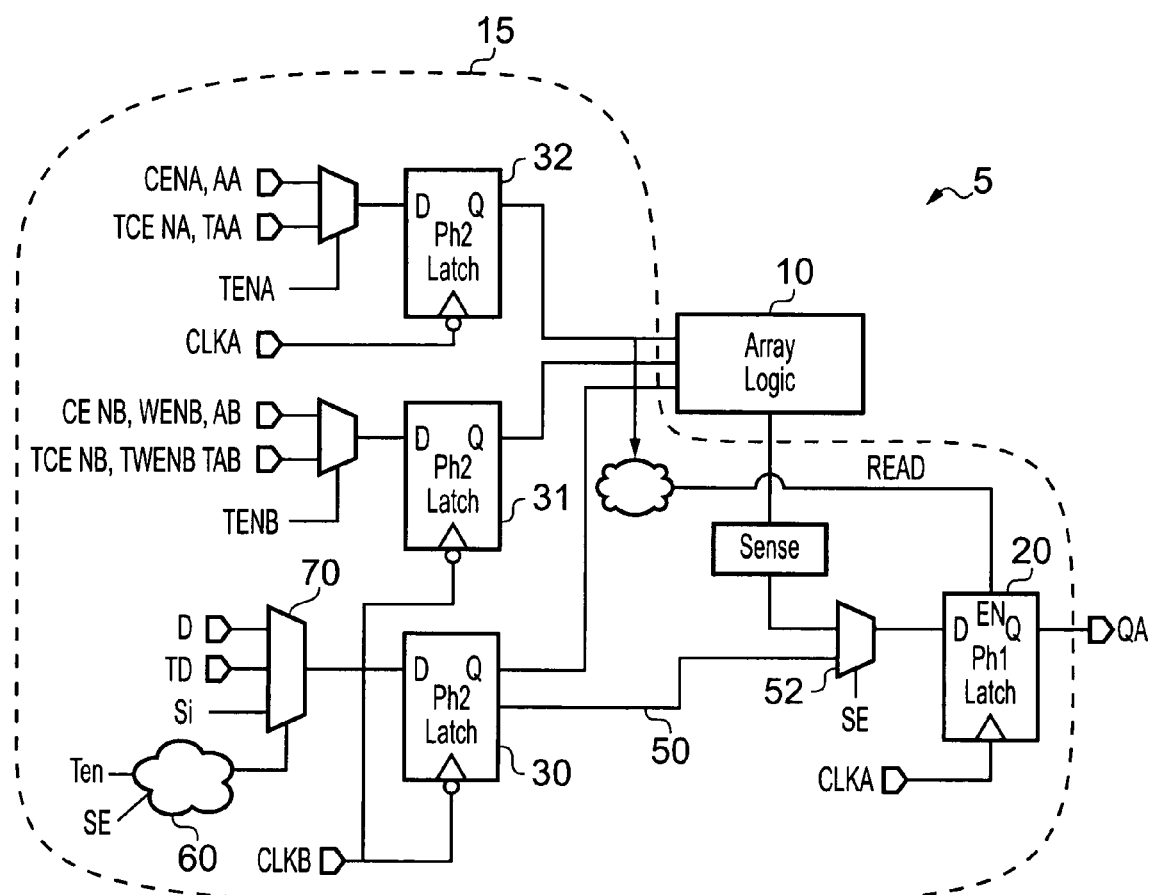
FIG. 2 shows a memory macro amended to support scan according to a non-limiting, example embodiment.

FIG. 2 shows a two-port memory according to a non-limiting, example embodiment. In this memory 5 there is array logic 10 for storing data and access circuitry 15 for providing access to this array logic 10. As in the prior art circuit of FIG. 1, there is an input latch 30 and an output latch 20. There are also the additional test input latches 32 and 31 which we need not be concerned with.

In this embodiment there is a path 50 and multiplexer 52 which together provide a scan path for scan data input to input latch 30 via scan input si allowing it to pass directly to output latch 20 and avoid the array logic 10.

In response to a scan enable signal SE being sent to logic 60 and to multiplexer 52 the scan input si of multiplexer 70 is selected and data at this input is sent via input latch 30 and scan path 50, 52 to latch 20. In this way input latch 30 and output latch 20 form a flip flop with scan path 50, 52 and thus scan data can be input and output to the memory, using latches that are also used in functional storage mode.

In this embodiment additional logic 60 is provided which controls multiplexer 70 to select either data D input in normal functional mode, scan input si in scan mode or test data input TD in test mode. Test mode allows test data to be stored in array logic 10 rather than functional data.

It should be noted that although in this embodiment the scan data path is shown as being selected by multiplexer 52 in response to a scan enable signal SE which is the same scan enable signal SE used by logic 70 to select a scan input, this signal could be a different signal in other embodiments. Thus, a signal could select the scan data path 50 at multiplexer 52 when the data D input is selected by multiplexer 70. This provides a write through feature in which data can be written from the input D to the output QA. This can enable data to be both written to the storage array and output without needing to fire the sense amplifiers as the data is output from the input. In other embodiments such as in scan capture mode, data input can simply be shifted through the latch and output without being stored in the storage array.

Figure 3A:
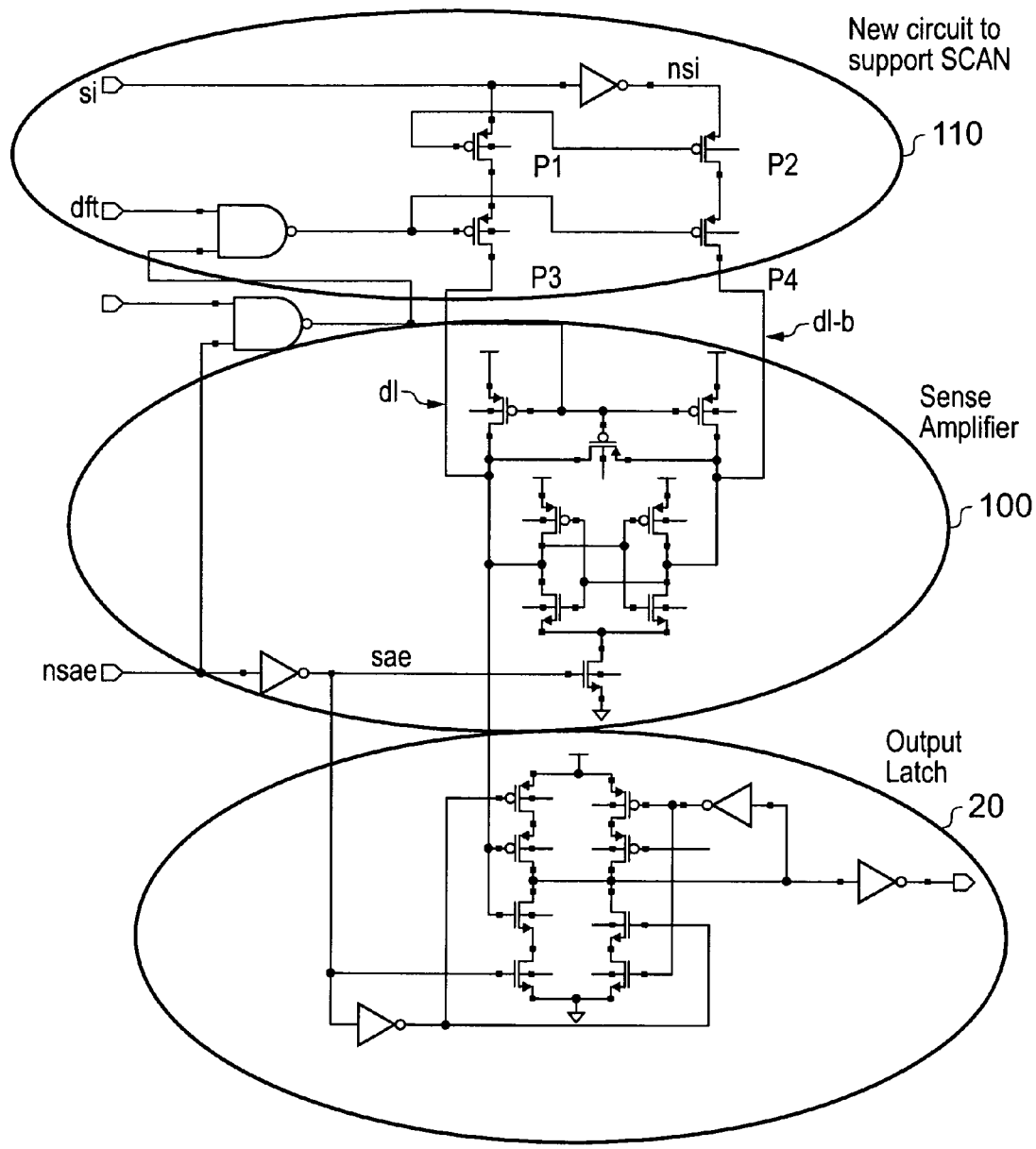
FIG. 3a shows a portion of a memory macro amended to support scan according to a non-limiting, example embodiment.

FIG. 3a shows a portion of a memory that supports scan according to another non-limiting, example embodiment. This circuit shows a conventional sense amplifier 100 for sensing a signal stored in a storage array and outputting it to output latch 20, in transistor form. There is an additional circuit 110 which has been introduced to support scan and acts as a multiplexer. This circuit has a scan input si and a select input DFT which acts to isolate the scan input si from the sense amplifier during functional mode. During normal functional operation the DFT pin is disabled and this blocks the scan input si by turning transistors P3 and P4 off. Thus, storage cell and sense amplifier 100 and the output latch 20 operate in a conventional fashion.

In scan mode, the DFT pin is asserted and transistors P3 and P4 are turned on. When the clock is low, the sensing signal SAE is also low. During this low phase the scan input si is propagated to the sensing nodes of the sense amplifier by transistors P1, P2, P3 and P4. When the clock goes high the sensing signal SAE is triggered high. During the high phase (PHI1 clock phase), the sense amplifier is enabled. At this point the scan input is sent and then latched into the output latch 20. A short time later, the PMOS transistors P1 and P2 are turned off and thereby isolate the scan input from the sense amplifier. This effectively eliminates input flushes through the output latch. In effect the sense amplifier 100, output latch 20 and circuit 110 act as an edge triggered flip flop during scan mode.

It should be noted, that in a two-port system such as that shown in FIG. 2 where the latches have clocks that are synchronised with each other, the apparatus could support scan by providing a multiplexer between the input and output latch to form a flip flop as is shown in FIG. 2 or by using the sense amplifier and output latch as a flip flop as is shown in FIG. 3a. It should be noted that although both ways of modifying an existing circuit to support scan could be used, generally the design of FIG. 2 is selected as the design of FIG. 3a requires more circuitry. However, in the case where the input and output clock are asynchronised then one cannot combine the input and output latches as is done in FIG. 2. In such circumstances the design of FIG. 3a can be used as the sense amplifiers 100 are synchronised with the output latch 20 and thus, a two-port memory array with input and output clocks that are asynchronised can support the scan function using a design according to FIG. 3a.

Figure 3B:
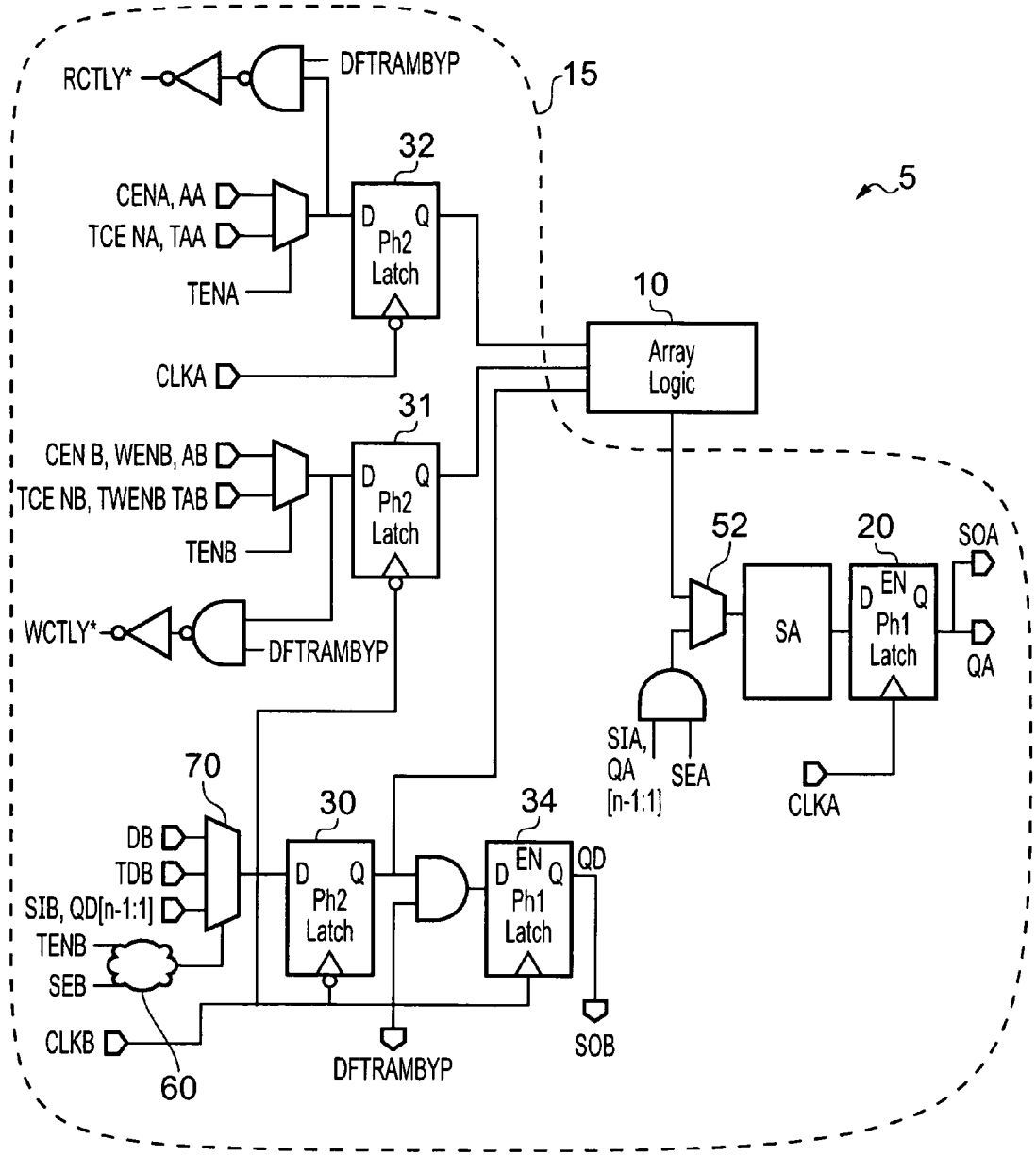

FIG. 3b shows a memory macro according to a non-limiting, example embodiment. It is similar to the memory macro of the prior art shown in Figure 1b, but rather than having an additional latch 22 to form a flip flop with latch 20 during scan, a sense amplifier SA is used as in the circuit shown in FIG. 3a.

The multiplexer 52, sense amplifier SA and output latch 20 operate in a similar way to the corresponding components described with respect to FIG. 3a. Thus, during scan the scan enable input SEA is enabled and scan input SIA passes via multiplexer 52 to sense amplifier SA. The sense amplifier is enabled and the scan input is sent and then latched into the output latch 20.

Figure 4A:
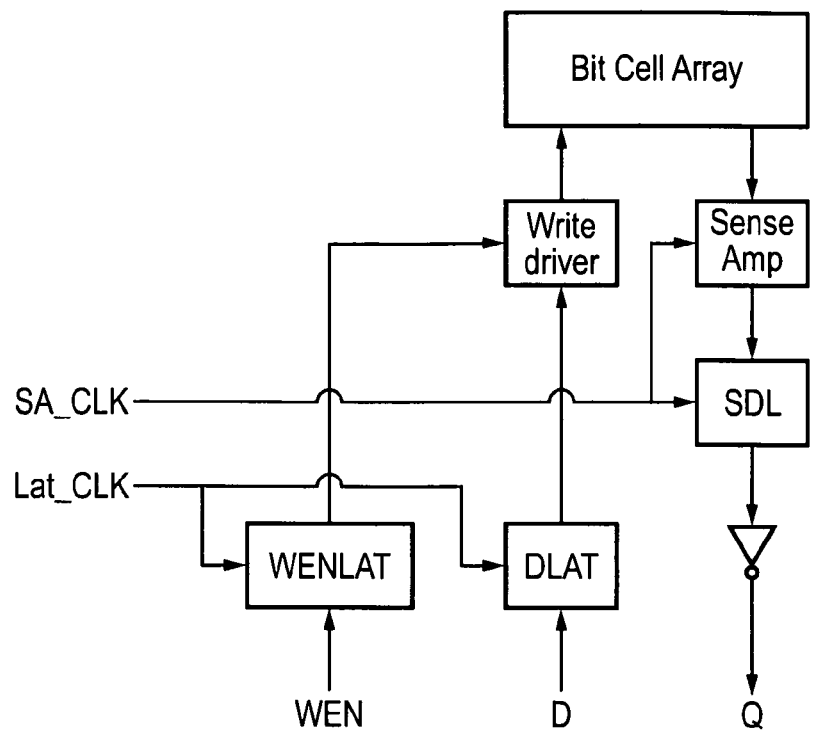
FIG. 4a shows a memory bit cell slice according to the prior art.
Figure 4B:
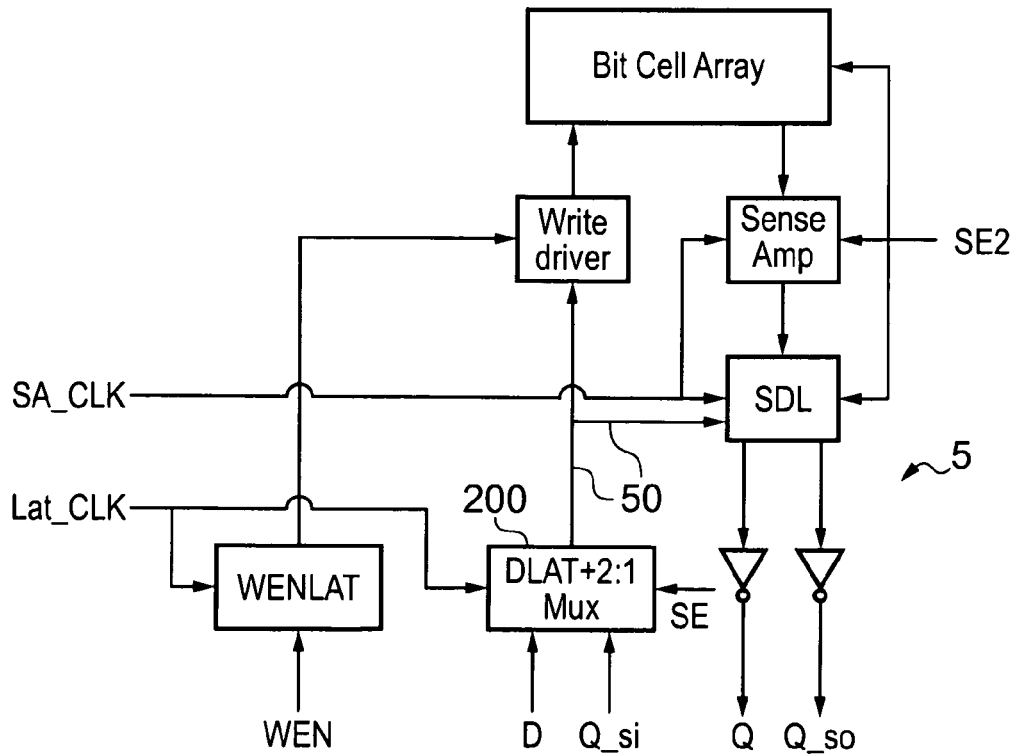
FIG. 4b shows a memory bit cell slice according to a non-limiting, example embodiment.

FIG. 4a shows a bit slice through a conventional memory and FIG. 4b shows a bit cell slice of a memory according to an embodiment of the present invention.

In functional operation both of these illustrated memories function in the same way. During a write cycle the write data D is input through an input latch DLAT and the write data D is merged with the write mask in the write driver which then drives the data into the bit cell array. During the read cycle the write driver is disabled and the bit cell array drives the inputs of the sense amplifier which senses the read value when clock value SA_CLK is fired. This value is then stored in the SDL set dominate output latch 100 which is arranged on the output of the sense amplifier and the value is then buffered and driven out on the output pin Q.

In order to be able to support scan the device of FIG. 4A is amended as is shown in FIG. 4b. Firstly a two to one multiplexer is added to the input latch DLAT to form a combined multiplexer latch 200. Thus, in a similar way to the memory of FIG. 2, the memory of FIG. 4B is amended to support scan using a multiplexer to provide a scan path that combines the input and output latches.

An additional control pin has been added SE which enables the scan and causes the scan input to be selected at latch 200 and the output to be sent via scan path 50 to the SDL output latch. There is an additional control signal SE2 which is added to the SDL latch and causes this to select as its input an input from the scan path 50 rather than an input from the sense amplifier which comprises data output by the bit cell array. Thus, during scan the scan enable signal SE is asserted so that the scan input follows scan path 50 to latch SDL. The further enable signal SE2 is also asserted so that the input from scan path 50 is selected at this SDL latch.

In scan capture mode the scan enable signal is not set and therefore data is input via latch DLAT, however, as data is simply required to be latched through the scan chain and output the further enable SE2 signal is set and this selects data input 104, such that the data follows the scan path 50 is input via input 104 and output via latch SDL and does not pass through the bit cell array. The bit cell array and sense amplifiers are responsive to the SE2 signal to power down as they are not required and this saves power consumption.

In a scan shift cycle, the scan enable signal SE is set and therefore the scan input Q_Si is input to the multiplexer latch DLAT 200. In this case as in scan capture mode the further enable SE2 signal is set which means that the scan data follows the scan path 50 and is output via latch SDL. In this case the scan data also does not pass through the bit cell array. The circuit is arranged so that the bit cell array and the sense amplifiers are responsive to the further enable signal SE2 to be powered down in scan capture and scan shift cycle modes. Thus, in these modes these parts of the circuit are powered down and do not operate. This saves power consumption.

In write through mode the write data is sent to the bit cell array and a location is written but the same data is also passed through to the output of the memory, Q. Conventionally this has been done by firing the sense amp during the write operation, however with the new latch structure the additional input of latch 100 can be used to pass the write data through to the output via path 50 in parallel to writing the data to the bit cell array. Thus, the sense amplifiers do not need to be fired. The functionality as seen from the output Q is the same but the power is lower overall as firing the sense amp uses more power than using the new latch input.

Figure 5:
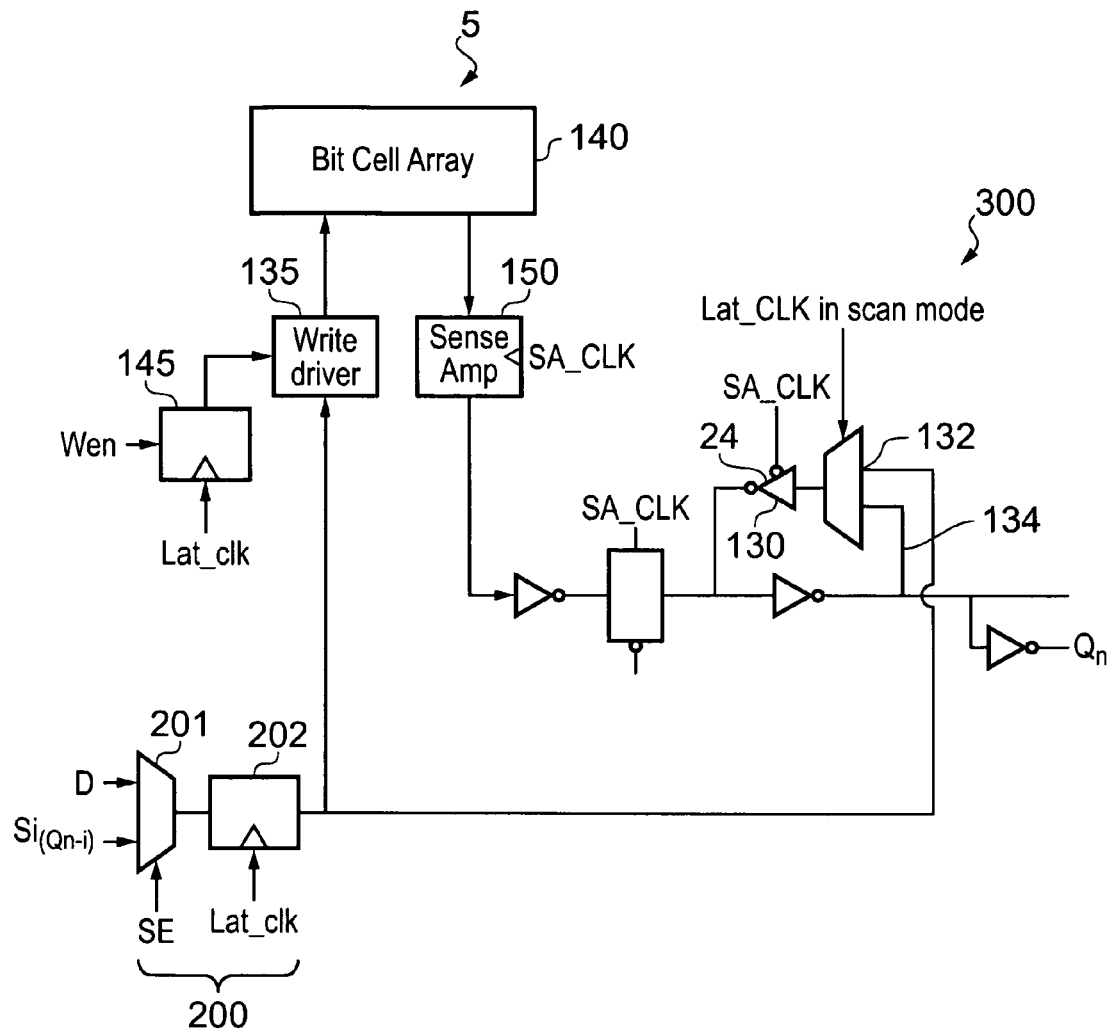
FIG. 5 shows a memory bit cell slice that is similar to that of FIG. 4b in greater detail.

Furthermore, in this embodiment the write through path is integrated into the SDL latch and this produces a zero timing penalty for the normal read path as can be seen from FIG. 5. During writes the forward path through the sense amplifier is not used and SA_CLK does not fire and this reduces power consumption.

In normal operation the scan enable SE and further enable SE2 signals are not asserted and thus, the data enters the latch 200 and is sent through to the write driver where it is written to the bit cell array. In a read mode the sense amplifier senses data and sends it to the SDL latch from where it is output.

Thus, during capture or scan cycles all activity in the bit cell array is disabled. The write buffer does not write data and the sense amplifier doesn't fire. During capture (or write through) the 2:1 mux latch 200 selects the D input. On the rising edge of the system clock, Lat_CLK fires and shuts DLAT. Another clock allows the write data to propagate through the SDL and through to the output Q. This clock is not shown. The timing to output is identical to a write cycle and DLAT and SDL act in the manner of the master slave in a flip flop.

During the scan cycle the 2:1 multiplexer on latch 200 selects scan input Q_SI. In this case the output Q_SO [I] is connected to Q_SI [I+1]. In other words the scan chain passes the value through these cells and through the master slave combinations of the two latches DLAT and SDL. The timing on Q is the same as during a write cycle with write through. Again the array and sense amplifier are powered down to reduce power.

It should be noted that the system may be set up so that the SE2 signal that selects the scan shift, scan capture and write through path and controls the power down of the sense amplifiers and in scan shift and scan capture the storage array is generated in response to the scan enable signal and in response to a "write through" request, the write through request being generated by a user.

In some embodiments, the left hand side and right hand side of the memory have their own scan chains to reduce the length of each scan chain. Each scan chain has its own scan input SI which is connected to the Q_SI input of the MSB in the scan chain and a scan output pin which is a copy of Q of the LSB in the scan chain. The scan input/output pins allow the scan chain to be stitched together with other scan chains which may be present in other memories or in standard cell logic as is required.

FIG. 5 shows a similar memory to that of FIG. 4a, with SDL latch 300 shown in circuit form such that the integration of the multiplexer 201 within the latch 202 can be seen. There are two inputs to this memory device; data input D and scan input Si. These two inputs are received at multiplexer 201, which selects either the scan input Si in response to a scan enable signal SE, or the data input D. Input latch 202 receives data from multiplexer 10' and when the memory is operating in functional write mode with scan enable not asserted, the data input passes from the latch to write driver 135 which in response to a write enable signal received via latch 145 writes the value to the bit cell array 140. Thus, input latch 202 and multiplexer 201 correspond to DLAT 200 of FIG. 4b. In functional read mode, data stored in the storage array 140 is sensed by sense amplifiers 150 and is output to output latch 100. In functional mode the output latch 300 is clocked by SA_clk that also clocks the sense amplifier and the bit cell array. In this mode the multiplexer 132 within latch 300 has a select signal that is not clocked and that controls the multiplexer to constantly select input 134. Thus, output latch 130 acts as a standard latch and latches the received value and outputs it via output Qn. This Figure shows the nth bit slice of memory 5 and thus, the output value is the nth bit Qn of output value Q.

In scan mode, the scan enable signal SE is asserted and input Si is selected by multiplexer 201. This scan data is output by multiplexer 201 to latch 202, from where it is output to the secondary input 132 of output latch 300. In scan mode, the clock SA_clk to storage array 140 is switched off so that the storage array is not functional. Furthermore, there is no write enable signal, thus the output of latch 202 in scan mode is not received at bit cell array 140.

During scan mode SA_clk which clocks the bit cell array 140 and sense amplifier 150 and also clocks the transmission gate of the primary input to latch 300 and the tristate inverter 24 is not clocked so the bit cell array and sense amplifier are not operational, and tristate inverter 24 is permanently conducting. During scan mode the multiplexer 130 has lat_clk as its select signal and thus, selects between inputs 132 and 134 in response to this clock, and thus, this clock clocks the feedback loop and thus, the latch. The input latch 201 is also clocked by lat_clk, thus latch 300 and 201 are synchronised and form a flip-flop in scan mode and scan data passes through this flip-flop and is output at output Qn.

Multiplexer 130 is on the feedback loop of latch 300 and not on the forward read path and thus, it does not affect the performance of the latch in functional mode, but does provide an additional input for use in scan mode.

Although the memory 5 has been described with regard to functional and scan mode, it can also operate in write through mode, where the scan enable signal SE on multiplexer 201 is not asserted so that the data input D is selected. However, the write driver and sense amplifiers are powered down and SA—clk does not clock, so that the data is passed to the secondary input 132 of latch 300. The multiplexer 130 is clocked by lat_clk and the tristate inverter is permanently on, so that the latch 300 is synchronised with input latch 202 and the data is written through the input latch 202 and output latch 300.

Figure 6:
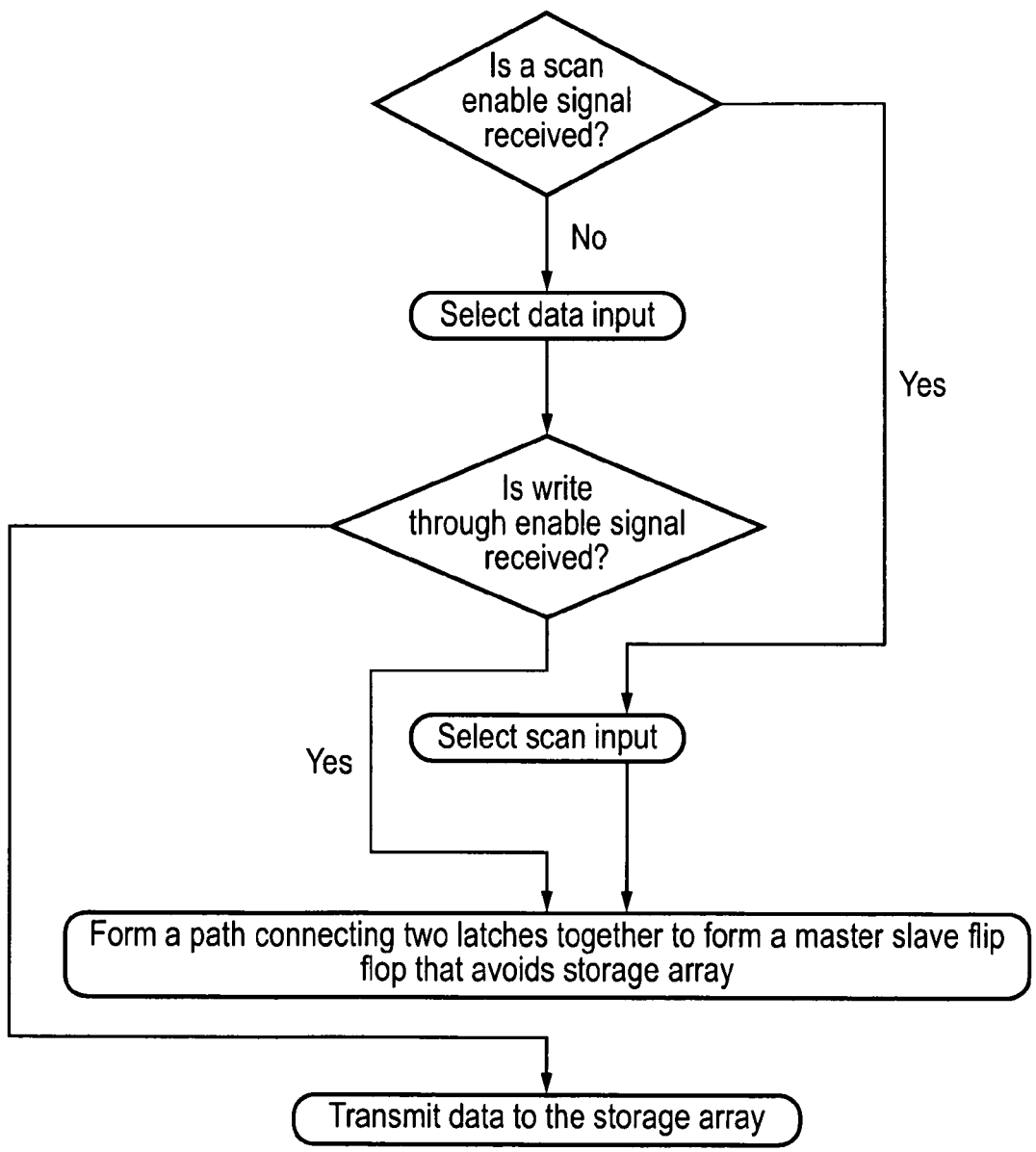
FIG. 6 shows a flow diagram illustrating a method according to a non-limiting, example embodiment.

FIG. 6 shows a flow diagram illustrating a method according to non-limiting, example embodiment.

In this method, it is determined whether or not a scan enable signal is received. If it is not then the data input is selected. If it is then the scan input is selected. If the data input is selected it is determined if a write through enable signal is received, this corresponds to the SE2 signal of FIG. 4b, if it is then the path connecting the two latches to form a flip flop is formed. This provides a path for the data that avoids the storage array. If a write through enable signal is not received then the data store is in functional storage mode and the input data is transmitted to the storage array.

If the scan enable signal is received then the scan input is selected and a path is formed that connects the two latches so that the scan data is sent via these two latches and not via the storage array as in the write through case.

Although illustrative example embodiments have been described in detail herein with reference to the accompanying drawings, it is to be understood that the claims are not limited to those embodiments, and that various changes and modifications can be effected therein by one skilled in the art without departing from the scope and spirit of the appended claims.

We claim:

1. A memory comprising:
a storage array for storing data; and
access circuitry for transmitting said data to and from said storage array, said access circuitry forming a data path for inputting and outputting data to said storage array, said access circuitry comprising a latch configured to latch in response to a first phase of a first clock signal and a further latch configured to latch in response to a second phase of a second clock signal, said further latch comprising an output latch for outputting said data from said storage array, and said first and second clock signals are synchronised with each other; said memory further comprising:
a multiplexer, a scan input and a scan enable input, said multiplexer being responsive to an asserted scan enable signal at said scan enable input to form a scan path comprising said latch and said further latch connected together to form a master slave flip flop, such that scan data input at said scan input passes through said master slave flip flop and not through said storage array while said scan enable signal is asserted and is output by said output latch.

2. A memory according to claim 1, said memory comprising a port for receiving read requests for reading data from said storage array, said port comprising a sense amplifier circuit for sensing and latching a value stored in a storage cell of said storage array in response to a sensing signal triggered by said first phase of said first clock signal, and said output port for outputting said sensed value; wherein said sense amplifier comprises said latch; and
said multiplexer is configured to isolate said scan input from said sense amplifier in response to said scan enable signal not being asserted and to connect said scan input to said sense amplifier in response to said scan enable signal being asserted.

3. A memory according to claim 2, wherein said first and second clock signal comprise a same clock signal.

4. A memory according to claim 2, wherein said multiplexer comprises at least one switch arranged to isolate said scan input from said sense amplifier circuitry in response to receipt of said asserted sensing signal.

5. A memory according to claim 4, wherein said at least one switch comprises a pmos transistor configured to receive said sensing signal and arranged between said scan input and said sense amplifier circuit.

6. A memory according to claim 2, wherein said storage cell comprises a bit cell to with a bit line and complementary bit line, said sensing amplifier being configured to sense data stored in said bit cell by sensing said bit lines, and said multiplexer being configured to transmit said scan input and a complementary value of said scan input to said bit line and complementary bit line respectively in response to said scan enable signal.

7. A memory according to claim 2, said port comprising a read port and said memory further comprising a write port for receiving write requests for writing data to said memory.

8. A memory according to claim 7, wherein said write port comprises an input latch for latching input data received at said write port, said input latch being clocked by a clock signal that is not synchronised with said second clock signal clocking said output latch.

9. A memory according to claim 2, wherein said port is a port configured to receive both write requests and read requests, said port comprising an input latch associated with said port for latching input data in response to a write request, said input latch being clocked by a clock signal that is synchronised with said clock clocking said output latch.

10. A memory according to claim 2, said memory comprising at least one further port, both said port and said at least one further port comprising ports configured to receive both write requests and read requests, each of said ports comprising an input latch associated with said port for latching input data in response to a write request, and an output latch, said input latches being clocked by a clock synchronised with said clock clocking said output latch.

11. A memory according to claim 1, wherein said memory comprises a port for receiving write requests, said port comprising an input latch for latching a received data value for transmission to said storage array in response to said first phase of said clock cycle, said input latch comprising said latch and said multiplexer being configured to route a signal from said input latch to said output latch in response to said scan enable signal being asserted and to route a signal from said input latch to said storage array in response to said scan enable signal not being asserted.

12. A memory according to claim 11, wherein said input latch and said multiplexer comprise a single multiplexer latch circuit.

13. A memory according to claim 11, said memory comprising a further multiplexer for receiving a scan input and a data input, said further multiplexer being configured to output said scan input to said input latch in response to a second scan enable signal being asserted, and to output said data input to said input latch in response to said second scan enable signal not being asserted, said access circuitry forming a data write through path from said input latch to said output latch, said data not passing through said storage array in response to said scan enable signal being asserted and said second scan enable signal not being asserted.

14. A memory according to claim 11, said port comprising a port configured to both read and write data, said storage array comprising at least one sense amplifier associated therewith for sensing a value stored in a cell of said storage array, said memory being configured to generate a sensing signal to activate said at least one sense amplifier in response to a read request, said memory being responsive to said scan enable signal being asserted to not generate said sensing signal.

15. A memory according to claim 11, said memory comprising at least one further port, said port and said at least one further port comprising ports configured to receive both write requests and read requests, each of said ports comprising an input latch associated with said port for latching input data in response to a write request and an output latch, said input latches being clocked by a clock synchronised with said clock clocking said output latch, said memory being configured to route a signal from said input latch of said at least one further port to said output latch in response to said scan enable signal being asserted and to route a signal from said input latch of said at least one further port to said storage array in response to said scan enable signal not being asserted.

16. A memory according to claim 1, said memory being configured to disable said storage array in response to said scan enable signal being asserted.

17. A method of providing a scan function to a memory, said memory comprising:

a storage array for storing data; and
access circuitry for transmitting said data to and from said storage array, said access circuitry forming a data path for inputting and outputting data to said storage array; said access circuitry comprising a latch configured to latch in response to a first phase of a first clock signal and a further latch configured to latch in response to a second phase of a second clock signal, said further latch comprising an output latch for outputting said data from said storage array, and said first and second clock signals are synchronised with each other; said method comprising the steps of:
providing a multiplexer, said multiplexer having a scan input a data input, said multiplexer selecting between said scan input and data input in response to a scan enable signal;
inputting said scan enable signal to said multiplexer;
in response to said scan enable signal forming a scan path comprising said latch and said further latch connected together to form a master slave flip flop;
inputting scan data at said scan input and transmitting said input scan data through said master slave flip flop and not through said storage array.

18. A data storage means comprising:

a storage array means for storing data; and
access means for transmitting said data to and from said storage array means, said access means forming a data path for inputting and outputting data to said storage array means, said access means comprising a latching means for latching in response to a first phase of a first clock signal and a further latching means for latching in response to a second phase of a second clock signal, said further latching means comprising an output latching means for outputting said data from said storage array means, and said first and second clock signals are synchronised with each other; said data storage means further comprising:

a multiplexing means, a scan input means and a scan enable input means, said multiplexing means being responsive to an asserted scan enable signal at said scan enable input to form a scan path comprising said latching means and said further latching means connected together to form a master slave flip flop means, such that scan data input at said scan input passes through said master slave flip flop means and not through said storage array means while said scan enable signal is asserted and is output by said output latching means.

* * * * *